(12) United States Patent
Pöchmüller

(10) Patent No.: US 6,535,009 B1
(45) Date of Patent: Mar. 18, 2003

(54) CONFIGURATION FOR CARRYING OUT BURN-IN PROCESSING OPERATIONS OF SEMICONDUCTOR DEVICES AT WAFER LEVEL

(75) Inventor: Peter Pöchmüller, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/553,126

(22) Filed: Apr. 19, 2000

(30) Foreign Application Priority Data

Apr. 19, 1999 (DE) .......................... 199 17 586

(51) Int. Cl.⁷ .............................................. G01R 31/02
(52) U.S. Cl. ..................... 324/760; 324/158.1; 324/765
(58) Field of Search .............................. 324/158.1, 765, 324/763, 760, 758, 73.1; 438/18, 17; 257/48, 40

(56) References Cited

U.S. PATENT DOCUMENTS

| | | | | |
|---|---|---|---|---|
| 4,961,053 A | * | 10/1990 | Krug ........................ | 324/158.1 |
| 5,355,081 A | * | 10/1994 | Nakata et al. .............. | 324/765 |
| 5,838,163 A | * | 11/1998 | Rostoker et al. ............ | 324/763 |
| 5,899,703 A | * | 5/1999 | Kalter et al. ................. | 438/18 |
| 5,929,650 A | * | 7/1999 | Pappert et al. .............. | 324/763 |

* cited by examiner

*Primary Examiner*—Michael Sherry
*Assistant Examiner*—Jimmy Nguyen
(74) *Attorney, Agent, or Firm*—Laurence A. Greenberg; Werner H. Stemer; Gregory L. Mayback

(57) ABSTRACT

A configuration for carrying out burn-in processing for semiconductor devices at the wafer level. To this end, BIST units are allocated to the individual semiconductor chips, so that the burn-in processing operations can take place by use of a self-test and complicated probe cards can be dispensed with.

8 Claims, 1 Drawing Sheet

CONFIGURATION FOR CARRYING OUT BURN-IN PROCESSING OPERATIONS OF SEMICONDUCTOR DEVICES AT WAFER LEVEL

BACKGROUND OF THE INVENTION

Field of the Invention

The present invention relates to a configuration for carrying out burn-in processing operations of semiconductor devices at the wafer level. More specifically, a semiconductor wafer containing a multiplicity of semiconductor chips is subjected to a burn-in operation that subjects the integrated circuits and components produced in the semiconductor chips to externally supplied voltages at a raised temperature.

Burn-in processing operations for semiconductor devices, such as chips, produce artificial aging in the latter. Such artificial aging puts the semiconductor device in a state which it would otherwise not attain until after a relatively long period of operation. This allows all those semiconductor devices found to be faulty after burn-in to be picked out following the burn-in operation. In other words, a burn-in operation makes it possible to discard such semiconductor devices before they are fitted in appliances that would otherwise fail after the aforementioned relatively long period of operation.

During a burn-in operation, semiconductor devices are subjected to particular loading tests at raised temperatures, for example 140° C., by impressing predetermined voltage patterns on the semiconductor device. Thus, for example, dynamic random access memories (DRAMs) can be subjected to cyclic loading of the word lines ("word line cycling").

Burn-in processing operations are thus indispensable in practice, when customers are to be supplied with semiconductor devices whose reliability is ensured over a long period of operation. The burn-in processing operations make it possible to pick out semiconductor devices which may be developing faults before they are supplied to customers, so that the occurrence of faults after the semiconductor devices are fitted into the intended appliances can be prevented.

To date, burn-in processing operations have been carried out only at chip level and not at wafer level. In a burn-in operation for a chip, voltage must be applied to defined connections for the chip using approximately 60 connections, and probe cards having more than 1500 needles are currently not available. A wafer having approximately 1000 chips, however, which would require probe cards having approximately 60,000 needles for burn-in processing at the wafer level. This requirement is more than an order of magnitude above the currently available probe cards having approximately 1500 needles.

Burn-in processing operations at the chip level are encumbered by particular disadvantages, which is why there has for a long time been a considerable demand for burn-in at the wafer level. These disadvantages can be summarized as noted below. First, with burn-in at the chip level, the semiconductor devices are cast in plastic. If faults are detected after the burn-in operation, they cannot be repaired. This is particularly disadvantageous in the case of memory devices, for example, such as DRAMs, with redundant circuits which could in essence be activated using laser fusing, or burning through fuses, to replace cells which have failed, and hence to carry out repair. However, detected faults can be repaired in this way only if the chip has not yet been encased in plastic or another casing. Second, a conventional burn-in operation requires components to be fitted into separate holders with which contact is made during the burn-in operation. Such holders are frequently reused and subjected to high temperatures during the burn-in operation. This frequent reuse of the holders leads to contact problems of a general type, which can result in a reduction in the yield and, in all cases, necessitates frequent checking and conversion of burn-in boards or panels. Third, although burn-in processing operations are carried out, as far as possible, uniformly and in parallel, they occasion considerable equipment costs that can be attributed not least to the long burn-in times in the order of a few hours. Fourth, functional test programs are currently moved to the burn-in furnace as far as possible, since this allows complex test devices to be eliminated and product quality can be increased. As a result of the aforementioned parallel operation during burn-in, in which, as an example, 16 semiconductor devices are connected to the same address bus, signals are slow on account of the high capacitive load, which in turn has a negative effect on the processing time. It is also barely possible to register an individual faulty semiconductor device, since the information obtained merely indicates that one of the, by way of example, 16 semiconductor devices has a fault.

For the aforementioned reasons, repeated attempts have been made to begin burn-in processing operations at the wafer level ("wafer level burn-in" or "WLBI"). Therefore, during WLBI, burn-in takes place on the whole wafer before it is separated into the individual chips that are to be cast in plastic.

Since WLBI using probe cards is not possible for the aforementioned reasons, the below listed two possibilities have always been considered to date. Conventional contact-making methods are employed in which bonding wires of appropriate shape are used as thin probe needles. The wafer is then brought into contact with a board provided with such bonding wires.

In an unconventional procedure, a "Gore Mate" is used, for example, which is in essence made of an insulator incorporating thin metal balls made of gold, for example, which do not touch one another. If this "Gore Mate" is pressed between a wafer and an appropriately shaped contact structure, it can be assumed that the metal balls make points of contact, as long as the contact pads are of sufficient size and the spacing between the metal balls remains sufficiently small.

However, none of these previously conceived methods reliably enables burn-in processing operations to be carried out for semiconductor devices at the wafer level.

SUMMARY OF THE INVENTION

It is accordingly an object of the invention to provide a configuration for carrying out burn-in processing operations of semiconductor devices at the wafer level that overcomes the above-mentioned disadvantages of the prior art devices of this general type, which can be used simply and reliably at the wafer level.

With the foregoing and other objects in view there is provided, in accordance with the invention, in combination with a semiconductor wafer having a plurality of semiconductor chips, a configuration for carrying out burn-in processing operations of the semiconductor chips on the semiconductor wafer, the configuration has at least one built-in-self-test unit disposed in the semiconductor wafer for carrying out the. burn-in processing operations on the semiconductor chips, the burn-in processing operations subjecting the semiconductor chips to externally supplied voltages at an elevated temperature.

The invention achieves this object in a configuration of the type mentioned in the introduction with at least one BIST unit (BIST="built-in self-test") provided in the semiconductor wafer.

To date, BIST techniques have been used to produce self-test circuits for chips so that the test time can be reduced or circuits are obtained which test themselves automatically without requiring any additional complex external test equipment.

The present invention now advantageously applies the BIST technique at the wafer level by providing BIST configurations on the wafer which permit burn-in processing operations to be carried out. Thus, an essential feature of the present invention is the combination of BIST techniques with WLBI.

The general use of BIST techniques for WLBI is particularly advantageous because all the signals and patterns are produced on the wafer itself, and configurations which make full contact on the wafer, such as probe cards, can be dispensed with. In this case, for example, an individual BIST unit can be provided for each chip on the wafer or for a respective plurality of chips on the wafer. Such a unit can then supply the necessary control signals to one chip or to the plurality of chips in parallel.

When a BIST unit is provided for one chip or for a plurality of chips on the wafer, various global signals can be supplied to these units as supply signals, clock signals and command signals via the wafer. This is possible, for example, as a result of an additional metal plane being provided for the BIST interconnection.

It is particularly advantageous, however, if the BIST units are produced in the so-called "kerf", i.e. the so-called saw border of the individual chips, which disappears anyway after the wafer has been separated into the chips. If the BIST units are moved to the kerf, then virtually no additional chip surface area is required for the BIST units. Instead, these BIST units are located in the kerf, which disappears when the wafer is separated into the individual chips.

It is also particularly advantageous if results obtained in the WLBI operation are stored in electrical fuses and are held there ready for later test equipment. As a preference, the fuses can likewise be provided in the kerf. It is also possible for electrical or metal fuses to be accommodated in the kerf for programming the individual BIST units.

The present invention advantageously avoids the difficulties associated with the existing configurations for carrying out burn-in processing operations at the wafer level and combines BIST with WLBI: contact problems inevitably caused by probe cards with more than 1500 needles can be prevented. Nevertheless, the BIST allows reliable testing of the semiconductor devices during the WLBI operation.

Other features which are considered as characteristic for the invention are set forth in the appended claims.

Although the invention is illustrated and described herein as embodied in a configuration for carrying out burn-in processing operations of semiconductor devices at the wafer level, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENT

Figure 1:
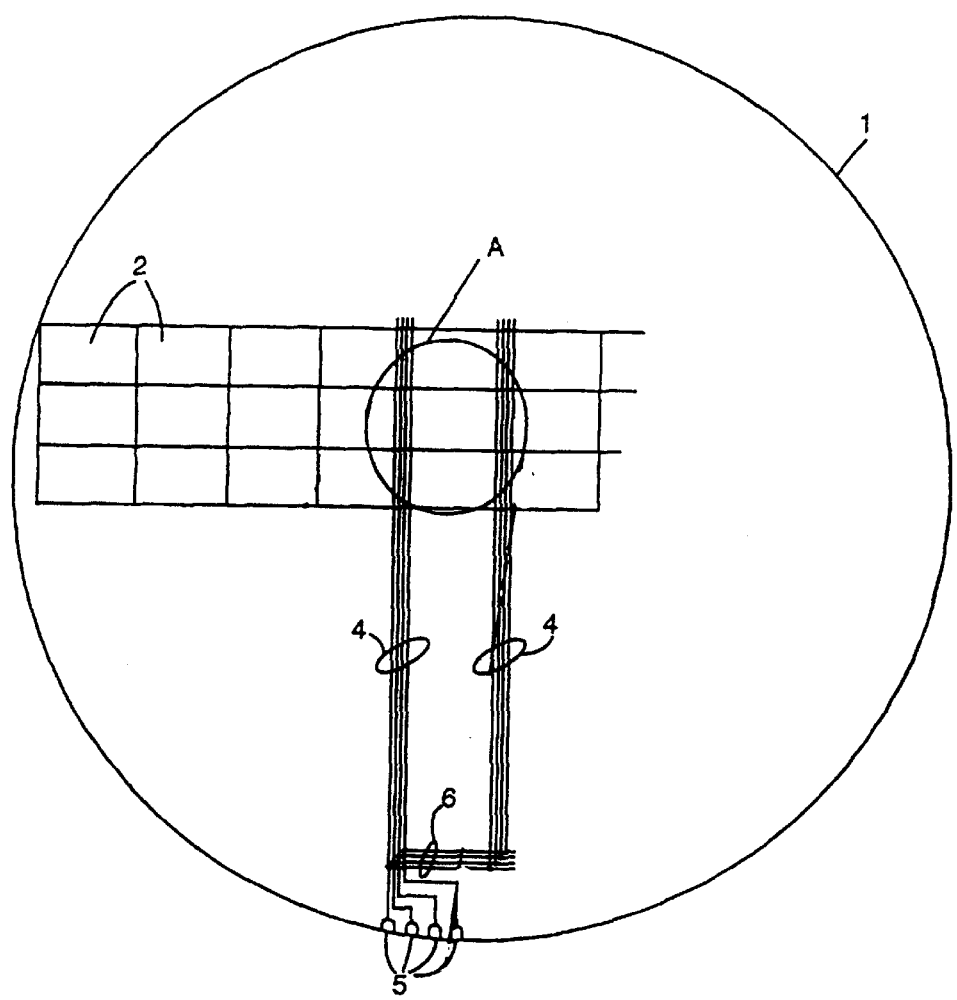
FIG. 1 is a diagrammatic plan view of a semiconductor wafer.

In all the figures of the drawing, sub-features and integral parts that correspond to one another bear the same reference symbol in each case. Referring now to the figures of the drawing in detail and first, particularly, to FIG. 1 thereof, there is shown a semiconductor wafer 1 containing a multiplicity of semiconductor chips 2 disposed on the wafer 1. Thus, the semiconductor wafer 1 can contain, for example, 1000 chips 2.

Figure 2:
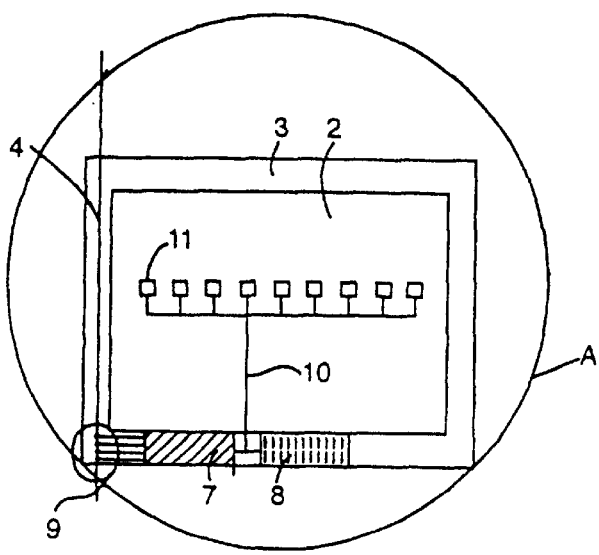
FIG. 2 is a enlarged plan view of detail A shown in FIG. 1.

FIG. 2 shows an enlarged view of detail A of the semiconductor wafer 1 with the chip 2 shown in FIG. 1.

The individual semiconductor chips 2 are connected to busses 4 and 6, which can be used to apply supply voltages, clock signals, command signals and so on to the semiconductor chips 2. To this end, the busses 4 are-provided with connections 5 to which supply voltages, clock signals, command signals and so on can be applied externally.

The busses 4 can run on a separate additional metalization plane. However, it is also possible for the busses 4 to be accommodated, if appropriate, in a kerf (saw border) 3, as shown in FIG. 2. In this case neither a further metalization plane nor additional surface area is required for the busses 4, 6.

It is also possible to provide on the semiconductor chips 2 contact pads 11 that can be used to apply needles for the burn-in processing operations that are to be carried out. In other words, not all the needles need be replaced by built-in-self-test (BIST) units 7 in the configuration according to the invention. Instead, it is entirely possible to retain a certain number of needles for each semiconductor chip and to control only some of the burn-in processing operations using the BIST units 7. Of course, if appropriate, it is possible to dispense with supplying via contact needles completely, with the result that the burn-in processing operations are all controlled using the BIST units 7.

FIG. 2 shows how the BIST unit 7 can be disposed in the kerf 3 on the semiconductor chip 2 and can be connected to the busses 4 via lines 9. The BIST unit 7 is in this case connected to the busses 4 and is connected to the contact pads 11, which may be present for contact needles, by use of a line 10.

It is naturally also possible for the BIST unit 7 to be provided—at the cost of surface area—directly in the semiconductor chip 2 rather than being accommodated in the saw border 3 of the semiconductor chip 2. In this case, one BIST unit 7 can be provided for a plurality of semiconductor chips 2 at the same time, so that not every semiconductor chip 2 need be provided with the BIST unit 7. It would also be possible to contemplate configuring the semiconductor chip 2, for example, as a BIST unit and then allocating a multiplicity of semiconductor chips to this one semiconductor chip without a separate BIST unit.

The invention thus provides numerous possibilities for allocating the BIST unit 7 to the semiconductor chips 2. It is conceivable for one semiconductor chip to be in the form of a BIST unit and in this way to supply all the other semiconductor chips on the semiconductor wafer 1 with the appropriate test programs for burn-in. It is likewise possible for each individual semiconductor chip 2 to be allocated the BIST unit 7, preferably in the kerf 3. Between these two extreme solutions, intermediate solutions are also conceivable in which one BIST unit 7 is allocated a plurality of the semiconductor chips 2, as already indicated.

There are also various possibilities for supplying the supply voltages, command signals, control signals, clock signals and so on. These can be applied using the busses 4 or using the contact pads 11. A preferred solution is one in which the contact pads 11 can be dispensed with. In this case, no probe cards are required, and the entire BIST unit 7 is produced in the semiconductor wafer 1, possibly in a further metalization plane.

Burn-in test results can be stored in electrical fuses 8, which can also be accommodated in the kerf 3. The fuses 8 can naturally also be provided at other locations in the chip 2 and can possibly be allocated to a plurality of the semiconductor chips 2. In the configuration shown in FIG. 2, the fuses 8 are each provided for each of the semiconductor chips 2, so that the organization can be highly decentralized. In this case, each of the BIST units 7 carries out the burn-in processing operations on its associated semiconductor chip 2. Test results stored in the fuses 8 in the kerf 3 can, if appropriate, be stored in an external memory before the semiconductor wafer 1 is separated into the individual semiconductor chips 2.

The fuses 8 can, if needed, be programmable. This makes it possible to vary the processing programs which are to be performed by the BIST units 7, with the result that the configuration is highly flexible overall because the processing operations to be carried out can be matched to the particular need using laser fuses, without mask changes at the level of the BIST units 7.

Each of the BIST units 7 is expediently connected to the external connections of the individual chips 2 so that the latter can be tested as individual modules. However, other connections within the semiconductor chip 2 are also possible. In any case, the connections between the BIST unit 7 and the individual connections of the semiconductor chip 2 can be made on the metalization planes which are present anyway or else on additional metalization planes. If appropriate, laser fuses can be used to isolate the BIST unit 7 from the semiconductor chip 2 after the burn-in processing has been completed, in order to reduce the capacitive load on the connections of the chip 2. This applies particularly if the BIST units 7 are not, as shown in the FIG. 2, provided in the kerf 3.

I claim:

1. In combination with a semiconductor wafer having a multiplicity of semiconductor chips and a kerf, a configuration for carrying out burn-in processing operations of the semiconductor chips on the semiconductor wafer, the configuration comprising:

a plurality of built-in-self-test (BIST) units disposed in the semiconductor wafer and carrying out the burn-in processing operations on the semiconductor chips on the semiconductor wafer, wherein substantially all of the semiconductor chips on the semiconductor wafer are each connected to a respective one of said BIST units, the burn-in processing operations subjecting the semiconductor chips to externally supplied voltages at an elevated temperature;

lines routed in the kerf on the semiconductor wafer and connected to said BIST units, said lines supplying a supply voltage, a clock signal, and command and control signals to said BIST units;

electrical fuses for storing burn-in test results for a later evaluation, said fuses connected to said BIST units and disposed in the kerf on the semiconductor wafer; and said BIST units being programmable using fuses provided in the kerf.

2. The configuration according to claim 1, wherein a semiconductor chip and a BIST unit are always exclusively assigned to each other.

3. The configuration according to claim 2, including contact pads disposed on the semiconductor chips and connected to said BIST units for supplying a supply voltage, a clock signal, and command and control signals to said BIST unit.

4. The configuration according to 3, wherein said BIST units are disposed on separate metalization planes in the semiconductor wafer.

5. The configuration according to claim 2, wherein said BIST units are disposed on separate metalization planes in the semiconductor wafer.

6. The configuration according to claim 1, wherein a plurality of semiconductor chips and one BIST unit are exclusively assigned to each other.

7. The configuration according to claim 6, including contact pads disposed on the semiconductor chips and connected to said BIST units for supplying a supply voltage, a clock signal, and command and control signals to said BIST unit.

8. The configuration according to 6, wherein said BIST units are disposed on separate metalization planes in the semiconductor wafer.

* * * * *